(12) United States Patent
Kwon et al.

(10) Patent No.: US 11,616,177 B2
(45) Date of Patent: Mar. 28, 2023

(54) DISPLAY APPARATUS AND MANUFACTURING METHOD THEREOF

(71) Applicant: SAMSUNG DISPLAY CO., LTD., Yongin-si (KR)

(72) Inventors: Jaejoong Kwon, Yongin-si (KR); Yunseon Do, Yongin-si (KR); Chio Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/183,685

(22) Filed: Feb. 24, 2021

(65) Prior Publication Data

US 2021/0184088 A1   Jun. 17, 2021

Related U.S. Application Data

(63) Continuation of application No. 16/564,556, filed on Sep. 9, 2019, now Pat. No. 10,971,664, which is a continuation of application No. 15/142,510, filed on Apr. 29, 2016, now Pat. No. 10,446,724.

(30) Foreign Application Priority Data

Aug. 31, 2015 (KR) .................. 10-2015-0123197

(51) Int. Cl.
*H01L 33/58* (2010.01)
*H01L 33/06* (2010.01)
*H01L 33/60* (2010.01)
*H01L 27/15* (2006.01)

(52) U.S. Cl.
CPC .............. *H01L 33/58* (2013.01); *H01L 27/15* (2013.01); *H01L 33/06* (2013.01); *H01L 33/60* (2013.01); *H01L 2933/0058* (2013.01); *H01L 2933/0091* (2013.01)

(58) Field of Classification Search
CPC ......... H01L 33/58; H01L 33/60; H01L 33/06; H01L 27/15; H01L 2933/0058; H01L 2933/0091; H01L 25/0753; H01L 27/156
See application file for complete search history.

(56) References Cited

U.S. PATENT DOCUMENTS

| 7,449,833 | B2 | 11/2008 | Kobayashi |
| 7,663,306 | B2 | 2/2010 | Imamura |
| 8,928,021 | B1 | 1/2015 | Bibl et al. |
| 8,933,433 | B2 | 1/2015 | Higginson et al. |

(Continued)

FOREIGN PATENT DOCUMENTS

| CN | 1822738 A | 8/2006 |
| CN | 101276860 A | * 10/2008 |

(Continued)

OTHER PUBLICATIONS

Chinese Office Action for Application No. 201610585937.9 dated Apr. 26, 2021.

(Continued)

*Primary Examiner* — Edward Chin
(74) *Attorney, Agent, or Firm* — Cantor Colburn LLP

(57) ABSTRACT

A display apparatus includes a substrate; a light-emitting diode on the substrate; a pixel separating layer surrounding the light-emitting diode; and a light dispersion layer on the light-emitting diode and the pixel separating layer.

13 Claims, 30 Drawing Sheets

(56) References Cited

U.S. PATENT DOCUMENTS

| | | |
|---|---|---|
| 8,987,765 B2 | 3/2015 | Bibl et al. |
| 9,029,880 B2 | 5/2015 | Sakariya et al. |
| 9,111,464 B2 * | 8/2015 | Bibl .................... H01L 25/0753 |
| 9,159,700 B2 | 10/2015 | Sakariya et al. |
| 9,178,123 B2 * | 11/2015 | Sakariya ................ H01L 33/36 |
| 9,349,993 B2 | 5/2016 | Oh et al. |
| 9,358,775 B2 | 6/2016 | Bower et al. |
| 9,484,504 B2 | 11/2016 | Bibl et al. |
| 9,666,564 B2 | 5/2017 | Lai et al. |
| 9,666,650 B2 | 5/2017 | Zhang |
| 9,698,204 B2 * | 7/2017 | Kamura ............... H01L 51/0096 |
| 9,704,821 B2 | 7/2017 | Meitl et al. |
| 9,825,106 B2 | 11/2017 | Li et al. |
| 9,865,577 B2 * | 1/2018 | Bibl .................... H01L 25/0753 |
| 9,876,000 B2 * | 1/2018 | Bibl ........................ H01L 33/60 |
| 9,911,722 B2 * | 3/2018 | Higginson ............ H01L 33/005 |
| 10,198,128 B2 * | 2/2019 | Lim ........................ G06V 40/13 |
| 2011/0284881 A1 * | 11/2011 | Shikina ................ G09G 3/3233 257/E27.121 |
| 2013/0228786 A1 * | 9/2013 | Park .................... H01L 51/5268 257/E29.273 |
| 2014/0159064 A1 * | 6/2014 | Sakariya ................ H01L 33/06 257/88 |
| 2014/0159067 A1 | 6/2014 | Sakariya et al. |
| 2014/0367633 A1 * | 12/2014 | Bibl .................... H01L 51/5281 257/13 |
| 2015/0137153 A1 | 5/2015 | Bibl et al. |
| 2016/0077328 A1 * | 3/2016 | Chong .................... G02B 3/14 359/291 |
| 2016/0079333 A1 * | 3/2016 | Shishido .............. G09G 3/3659 257/72 |
| 2017/0242549 A1 * | 8/2017 | Lim ...................... G06F 3/0421 |

FOREIGN PATENT DOCUMENTS

| | | |
|---|---|---|
| CN | 101276860 A | 10/2008 |
| CN | 101414666 A | 4/2009 |
| CN | 104035144 A | 9/2014 |
| CN | 104838508 A | 8/2015 |
| JP | 2009188237 A | 8/2009 |
| KR | 101319360 B1 | 10/2013 |
| KR | 1020150084922 A | 7/2015 |
| KR | 1020150085381 A | 7/2015 |

OTHER PUBLICATIONS

Yellow-green and amber InGaN micro-LED arrays now com true. [online]. pp. 1-2 [retrieved on Nov. 25, 2015]. Retrieved from the Internet: <URL: http://iopscience.iop.org/0268-1242/labtalk-article/48063.

* cited by examiner

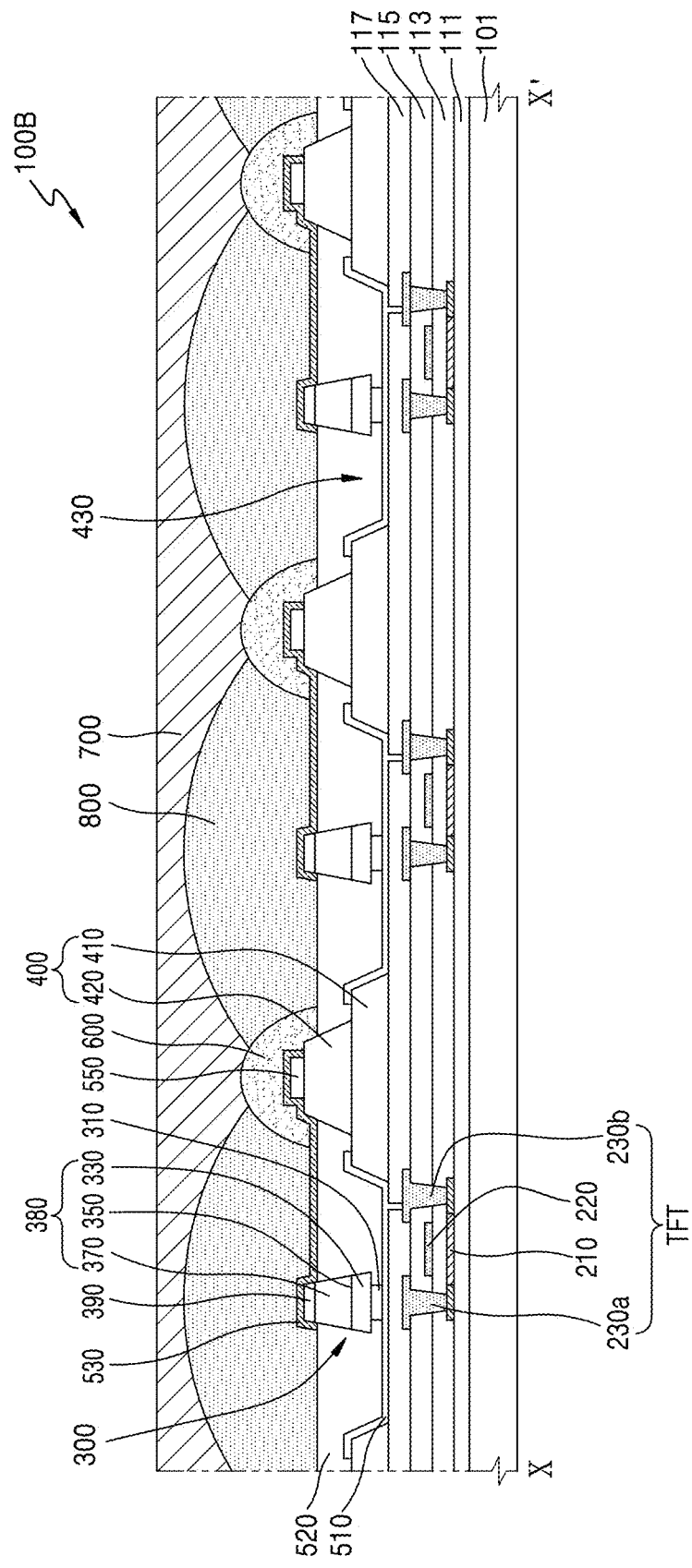

DISPLAY APPARATUS AND MANUFACTURING METHOD THEREOF

This application is a continuation application of U.S. patent application Ser. No. 16/564,556, filed on Sep. 9, 2019, which is a continuation application of U.S. patent application Ser. No. 15/142,510, filed on Apr. 29, 2016, which claims priority to Korean Patent Application No. 10-2015-0123197, filed on Aug. 31, 2015, and all the benefits accruing therefrom under 35 U.S.C. § 119, the content of which in its entirety is herein incorporated by reference.

BACKGROUND

1. Field

One or more exemplary embodiments relate to a display apparatus, and more particularly, to a display apparatus including a light-emitting diode.

2. Description of the Related Art

A light-emitting diode ("LED") is a device that converts an electrical signal into a form of light, such as an infrared ray, visible rays, etc., by using a compound semiconductor characteristic. The LED is widely used in household appliances, remote controllers, electronic display boards, and various automated devices. The field of use of the LED is continually widening, as the LED is applied in a wide range of electronic devices, from small hand-held electronic devices to large display devices.

SUMMARY

A display apparatus that utilizes a light-emitting diode ("LED") typically has a small light-emitting area, and display quality may be thereby deteriorated. One or more exemplary embodiments relate to a display apparatus having a structure that allows an emission area of the display apparatus including a light-emitting diode ("LED") having a small emission portion to be enlarged.

According to an exemplary embodiment, a display apparatus includes a substrate; a light-emitting diode on the substrate; a pixel separating layer surrounding the light-emitting diode; and a light dispersion layer arranged on the light-emitting diode and the pixel separating layer.

In an exemplary embodiment, the display apparatus may further include an inorganic layer between the light-emitting diode and the light dispersion layer, where the inorganic layer covers the light-emitting diode.

In an exemplary embodiment, the display apparatus may further include a lens arranged between the inorganic layer and the light dispersion layer, where the lens covers the light-emitting diode between the light-emitting diode and the pixel separating layer.

In an exemplary embodiment, a refractive index of the lens may be lower than a refractive index of the light-emitting diode, and may be higher than a refractive index of air.

In an exemplary embodiment, the pixel separating layer may have a height lower than a height of the lens, and may have a concave upper surface.

In an exemplary embodiment, the pixel separating layer may have a height lower than a height of the lens, and may have a convex upper surface.

In an exemplary embodiment, the display apparatus may further include a lens between the light-emitting diode and the pixel separating layer, and arranged below the light dispersion layer, where the lens covers the light-emitting diode.

In an exemplary embodiment, a refractive index of the lens may be lower than a refractive index of the light-emitting diode, and may be higher than a refractive index of air.

In an exemplary embodiment, the pixel separating layer may have a height lower than a height of the lens and may have a convex upper surface.

In an exemplary embodiment, the pixel separating layer may have a height lower than a height of the lens and may have a concave upper surface.

In an exemplary embodiment, the pixel separating layer may include a light reflective material.

In an exemplary embodiment, the pixel separating layer may include a light-scattering material.

In an exemplary embodiment, the pixel separating layer may include a material capable of absorbing at least a portion of light.

In an exemplary embodiment, the light dispersion layer may include a transparent medium and micro-particles in the transparent medium.

According to another exemplary embodiment, a method of manufacturing a display apparatus includes: providing a light-emitting diode on a substrate; providing a pixel separating layer on the substrate to surround the light-emitting diode; and providing a light dispersion layer on the light-emitting diode and the pixel separating layer.

In an exemplary embodiment, the method may further include providing an inorganic layer covering the light-emitting diode, before the providing the pixel separating layer.

In an exemplary embodiment, the method may further include providing a lens covering the light-emitting diode between the light-emitting diode and the pixel separating layer, before the providing the light dispersion layer.

In an exemplary embodiment, the method may further include providing a lens covering the light-emitting diode before the providing the light dispersion layer, and the providing the light dispersion layer may include providing the light dispersion layer on the lens and the pixel separating layer.

In an exemplary embodiment, the method may further include providing a lens covering the light-emitting diode before the providing the pixel separating layer, and the providing the pixel separating layer may include providing the pixel separating layer around the lens.

In an exemplary embodiment, the method may further include providing an inorganic layer covering the light-emitting diode, before the providing the lens, and the providing the lens may include providing the lens on the inorganic layer.

BRIEF DESCRIPTION OF THE DRAWINGS

These and/or other features will become apparent and more readily appreciated from the following description of the exemplary embodiments, taken in conjunction with the accompanying drawings, in which:

FIG. 5 is a cross-sectional view taken along line X-X' of a display apparatus according to another alternative exemplary embodiment;

DETAILED DESCRIPTION

Figure 1:
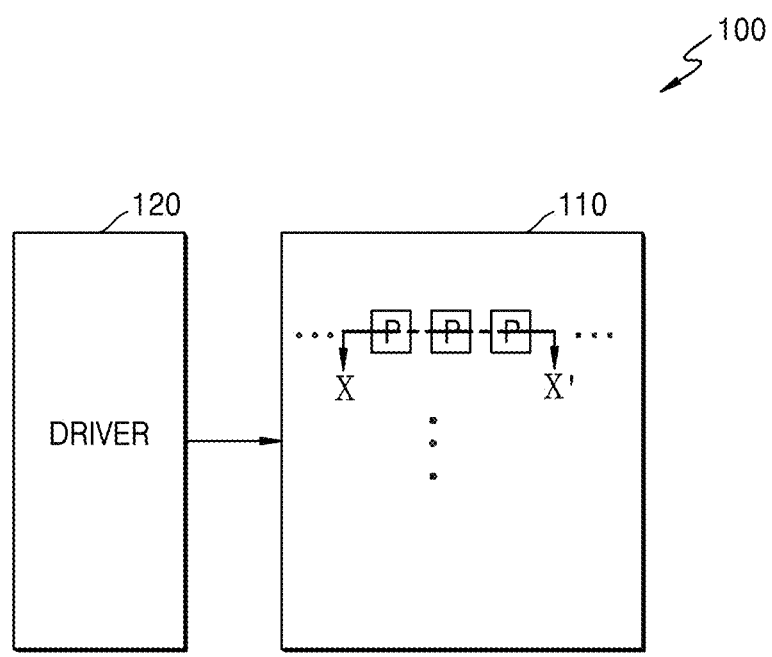
FIG. 1 is a plan view of a display apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. "Or" means "and/or." As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one element, component, region, layer or section from another element, component, region, layer or section. Thus, a first "element," "component," "region," "layer" or "section" discussed below could be termed a second element, component, region, layer or section without departing from the teachings herein.

As used herein, the singular forms "a," "an," and "the" are intended to include the plural forms as well, unless the context clearly indicates otherwise.

It will be further understood that the terms "comprises" and/or "comprising" or "includes" and/or "including" when used herein specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or component is referred to as being "on," another layer, region, or component, it can be directly on the other element or intervening elements may be present therebetween. In contrast, when an element is referred to as being "directly on" another element, there are no intervening elements present.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2A:
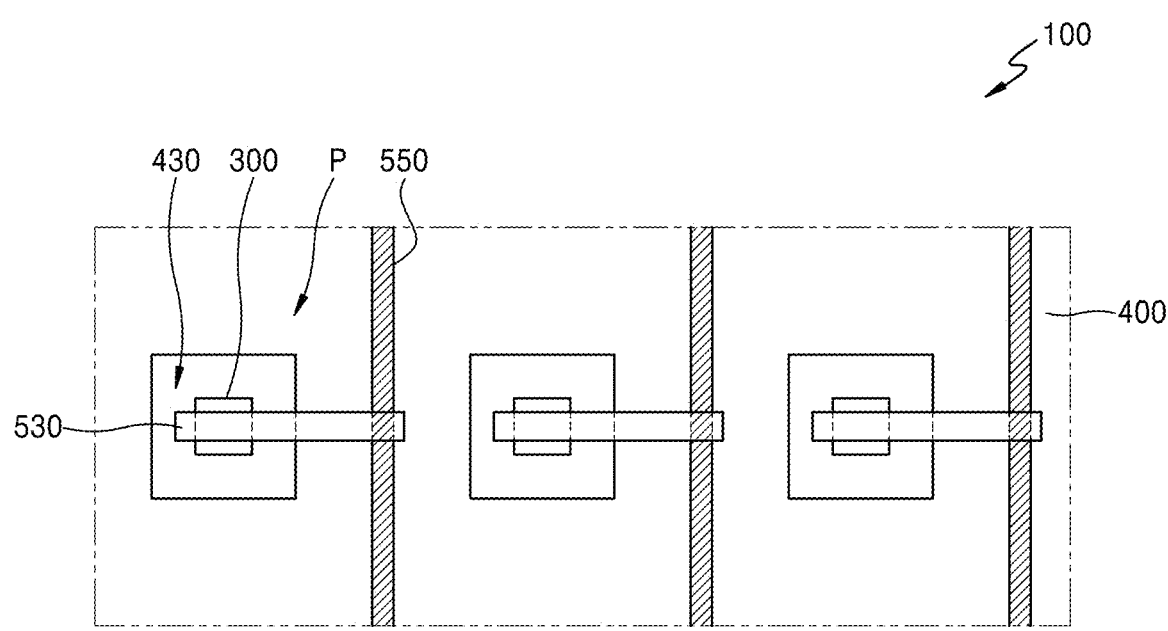
FIG. 2A is an enlarged plan view of pixels along line X-X' in FIG. 1.

FIG. 1 is a plan view of a display apparatus 100 according to an exemplary embodiment. FIG. 2A is an enlarged plan view of pixels along line X-X' in FIG. 1, 2B is a cross-sectional view taken along line X-X' of FIG. 1, and FIG. 2C is an enlarged plan view of pixels of a display apparatus according to an alternative exemplary embodiment.

Referring to FIG. 1, an exemplary embodiment of the display apparatus 100 may include a display unit 110 and a driver 120. The display unit 110 may include a plurality of pixels P arranged on a substrate in a matrix form. The driver 120 may include a scan driver for applying a scan signal to a scan line connected to the pixels P and a data driver for applying a data signal to a data line connected to the pixels P. The driver 120 may be arranged in a non-display area on the substrate, which may be around a display area in which the pixels P are arranged. The driver 120 may include an integrated circuit chip to be directly mounted on the substrate on which the display unit 110 is disposed, or may be mounted on a flexible printed circuit film. Alternatively, the driver 120 may be bonded to the substrate as a form of a tape carrier package ("TCP"), or may be directly formed on the substrate.

Figure 2B:
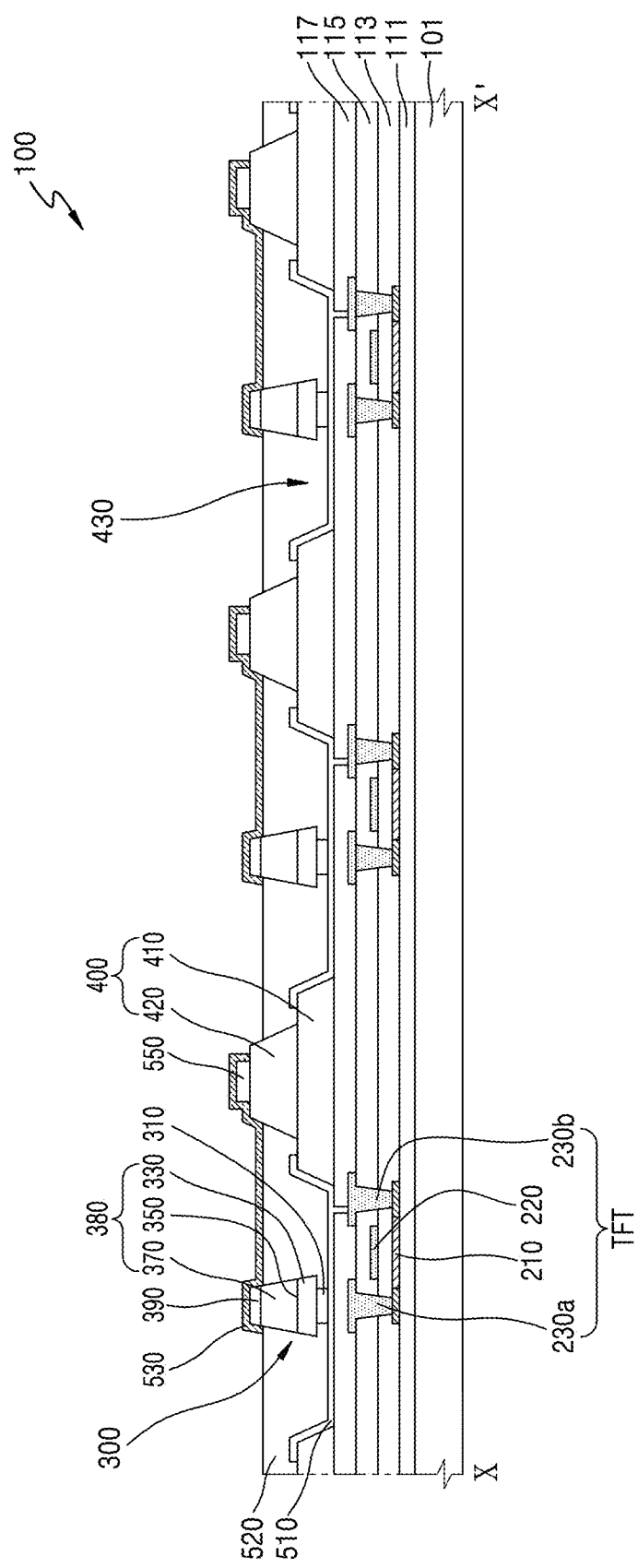
FIG. 2B is a cross-sectional view taken along line X-X' of FIG. 1.
Figure 2C:
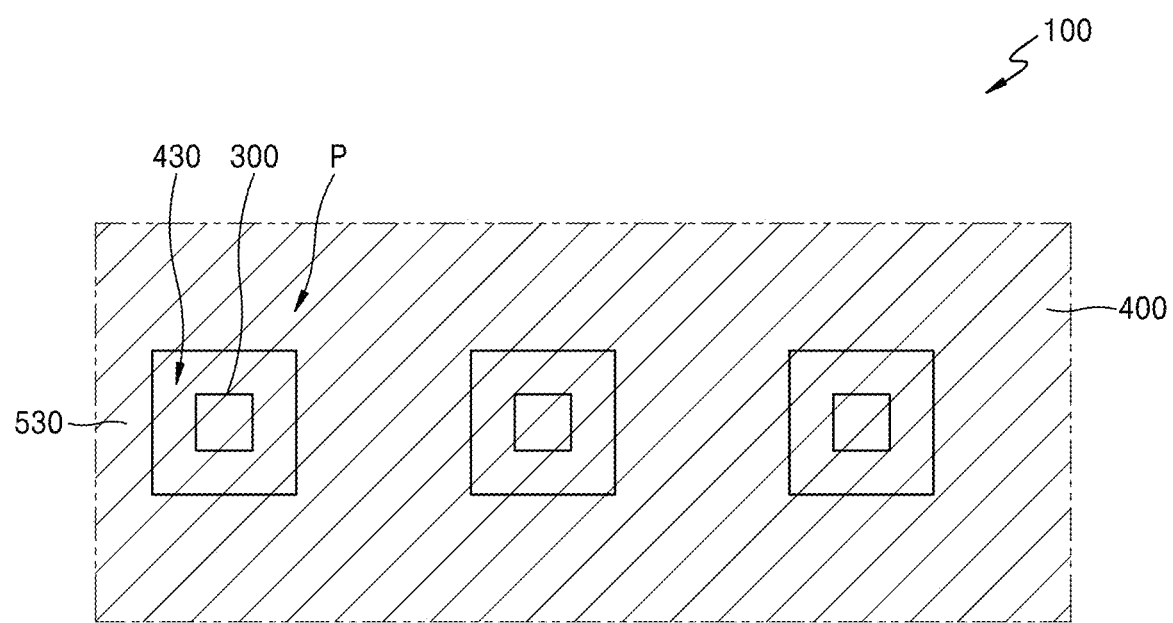
FIG. 2C is an enlarged plan view of pixels of a display apparatus according to an alternative exemplary embodiment.

Referring to FIGS. 2A and 2B, each pixel P may include a light-emitting diode ("LED") 300 and a pixel circuit connected to the LED 300. The pixel circuit may include a transistor ("TFT") and a capacitor. The pixel circuit is connected to each of the scan line and the data line which cross each other. FIG. 2B illustrates an exemplary embodiment where the pixel circuit of each pixel P includes a single TFT.

A buffer layer 111 may be disposed on a substrate 101, and the TFT and the LED 300 may be disposed on the buffer layer 111.

The substrate 101 may include glass or plastic, for example. The buffer layer 111 may effectively prevent impurity elements from penetrating into the substrate 101 and planarize the substrate 101. The buffer layer 111 may have a single layer structure or a multi-layer structure, a layer of which includes an inorganic material, such as $SiN_x$ and/or $SiO_x$.

The TFT may include an active layer 210, a gate electrode 220, a source electrode 230a, and a drain electrode 230b. The active layer 210 may include a semiconductor material, and may have a source area, a drain area and a channel area between the source area and the drain area of the active layer 210. The gate electrode 220 is disposed on the active layer 210 to correspond to the channel area. The source electrode 230a and the drain electrode 230b are electrically connected to the source area and the drain area of the active layer 210, respectively. A first insulating layer 113, which includes an inorganic insulating material, is disposed between the active layer 210 and the gate electrode 220, as a gate insulating layer. A second insulating layer 115 is disposed between the gate electrode 220 and the source electrode 230a/the drain electrode 230b, as an interlayer insulating layer. A third insulating layer 117 is disposed on the source electrode 230a/the drain electrode 230b, as a planarization layer. The second insulating layer 115 and the third insulating layer 117 may include an organic insulating material or an inorganic insulating material. In one exemplary embodiment, for example, the second insulating layer 115 and the third insulating layer 117 may have a single layer structure including an organic insulating material or an inorganic insulating material. Alternatively, the second insulating layer 115 and the third insulating layer 117 may have a multi-layer structure of a layer including the organic insulating material and a layer including the inorganic insulating material.

FIG. 2B illustrates one exemplary embodiment including a top gate-type TFT, in which the gate electrode 220 is disposed on the active layer 210. However, the present inventive concept is not limited thereto, and in an alternative exemplary embodiment, the gate electrode 220 may be disposed below the active layer 210.

A bank layer 400 defining a pixel area may be arranged on the third insulating layer 117. The bank layer 400 includes a first bank 410 by which a concave portion 430 for accommodating the LED 300 is defined. A height of the first bank 410 may be determined by a height and a viewing angle of the LED 300. A size (width) of the concave portion 430 may be determined by a resolution, a pixel density, etc. of the display apparatus 100. According to an exemplary embodiment, the height of the LED 300 may be greater than the height of the first bank 410. Although FIG. 2A illustrates one exemplary embodiment in which the concave portion 430 has a quadrangular shape, exemplary embodiments are not limited thereto. Alternatively, the concave portion 430 may have various shapes including a polygon, a rectangle, a circle, a circular cone, an oval, a triangle, etc.

A first electrode 510 is arranged along a side surface and a bottom surface of the concave portion 430, and an upper surface of the first bank 410 around the concave portion 430. The first electrode 510 is electrically connected to the source electrode 230a or the drain electrode 230b of the TFT, via a via-hole formed in the third insulating layer 117. In such an embodiment, as shown in FIG. 2B, the first electrode 510 is electrically connected to the drain electrode 230b.

The bank layer 400 may further include a second bank 420 on the first bank 410. The first bank 410 and the second bank 420 define a step portion, and a width of the second bank 420 may be less than a width of the first bank 410. A side of the second bank 420 is spaced apart from a side of the first bank 410 when viewed from a top plan view, which is a plan view in a thickness direction of the display apparatus 100, and may or may not cover a portion of the first electrode 510 on the first bank 410.

A conductive layer 550 electrically connected to a second electrode 530 is disposed on the second bank 420. In an exemplary embodiment, where the conductive layer 550 is insulated from the first electrode 510, the second bank 420 may be omitted, and the conductive layer 550 may be disposed on the first bank 410. Alternatively, as illustrated in FIG. 2C, the second bank 420 and the conductive layer 500 may be omitted, and the second electrode 530 may be disposed over, e.g., formed throughout, the substrate 101, as a common electrode for the pixels P. The conductive layer 550 may be arranged in a direction parallel to the data line or the scan line.

The first bank 410 and the second bank 420 may include a material capable of absorbing at least a portion of light, a light reflective material, or a light-scattering material. The first bank 410 and the second bank 420 may include a half-transparent or a non-transparent (opaque) insulating material with respect to visible rays (for example, light of a wavelength range of about 380 nanometers (nm) to about 750 nm). The first bank 410 and the second bank 420 may include at least one selected from: a thermoplastic resin, such as polycarbonate ("PC"), polyethylene terephthalate ("PET"), polyether sulfone ("PES"), polyvinyl butyral, polyphenylene ether, polyamide, polyether imide, a norbornene system resin, a methacrylic resin, and a cyclic polyolefin system; a thermosetting resin, such as an epoxy resin, a phenol resin, a urethane resin, an acryl resin, a vinyl ester resin, an imide-based resin, a urethane-based resin, a urea resin, and a melamine resin; and an organic insulating material, such as polystyrene, polyacrylonitrile, and polycarbonate, but not being limited thereto. The first bank 410 and the second bank 420 may include an inorganic insulating material, such as an inorganic oxide material or an inorganic nitride material, such as $SiO_x$, $SiN_x$, $SiN_xO_y$, $AlO_x$, $TiO_x$, $TaO_x$, and $ZnO_x$. However, the materials of the first bank 410 and the second bank 420 are not limited thereto. According to an exemplary embodiment, the first bank 410 and the second bank 420 may include a non-transparent material, such as a black matrix material. In such an embodiment, an insulating black matrix material may include at least one selected from: a resin or paste, which includes an organic resin, a glass paste and a black pigment; and a metal particle, such as nickel, aluminum, molybdenum, an alloy thereof, a metal oxide particle (for example, a chrome oxide), or a metal nitride particle (for example, a chrome nitride). According to another exemplary embodiment, the first bank 410 and the second bank 420 may be a distributed Bragg reflector ("DBR") having high reflection or a mirror reflector including a metal.

The LED 300 is disposed in the concave portion 430 defined by the first bank 410. In an exemplary embodiment, the LED 300 may be a micro-LED. Here, the term "micro" may indicate a size of about 1 micrometer (μm) to about 100 μm. However, exemplary embodiments are not limited thereto, and the LED 300 may have a greater or smaller size than about 1 to about 100 μm. In one exemplary embodiment, for example, a single LED 300 or a plurality of LEDs 300 may be picked up on a wafer and transferred onto the substrate 101, by a transportation device, to be accommodated in the concave portion 430 of the substrate 101. According to an exemplary embodiment, the LED 300 may be accommodated in the concave portion 430 of the substrate 101, after the first bank 410 and the first electrode 510 are provided or formed. According to another exemplary embodiment, the LED 300 may be transferred onto the substrate 101 to be accommodated in the concave portion 430 of the substrate 101, after the second bank 420 and the conductive layer 550 are further provided or formed. The LED 300 may be a color LED, e.g., a red, green, blue or white LED, or an ultraviolet ("UV") LED.

The LED 300 may include a p-n diode 380, a first contact electrode 310, and a second contact electrode 390. The first contact electrode 310 and/or the second contact electrode 390 may include one or more layers, and may include a conductive material including a metal, a conductive oxide or a conductive polymer. The first contact electrode 310 and the second contact electrode 390 may selectively include a reflective layer, for example, a silver layer. The first contact electrode 310 is electrically connected to the first electrode 510, and the second contact electrode 390 is electrically connected to the second electrode 530. The p-n diode 380 may include a p-doping layer 330 in a bottom portion thereof, a quantum well layer 350, and an n-doping layer 370 in an upper portion of the p-n diode 380. According to an alternative exemplary embodiment, the p-doping layer 330 may be in the upper portion of the p-n diode 380, and the n-doping layer 370 may be in the bottom portion of the p-n diode 380. The p-n diode 380 may have a linear side wall, or a tapered side wall, which is tapered from top to bottom or from bottom to top.

The first electrode 510 may include a reflection electrode, and may include one or more layers. In one exemplary embodiment, for example, the first electrode 510 may include a metal element, such as aluminum, molybdenum, titanium, tungsten, silver, gold, or an alloy thereof. The first electrode 510 may include a transparent conductive layer including a conductive material, and a reflective layer. The conductive material may include a carbon nanotube film, a transparent conductive polymer, or a transparent conductive oxide ("TCO"). The TCO may include indium tin oxide ("ITO"), indium zinc oxide ("IZO"), ZnO, or $In_2O_3$. According to an exemplary embodiment, the first electrode 510 may have a triple-layer structure, including upper and lower transparent conductive layers and a reflective layer therebetween. The second electrode 530 may include a transparent or a half-transparent electrode. In one exemplary embodiment, for example, the second electrode 530 may include the transparent conductive material described above, and may include at least one selected from Ag, Al, Mg, Li, Ca, Cu, LiF/Ca, LiF/Al, MgAg, and CaAg.

A passivation layer 520 surrounds the LED 300 in the concave portion 430. The passivation layer 520 covers the concave portion 430 and the first electrode 510 by filling a space between the bank layer 400 and the LED 300. The passivation layer 520 may include an organic insulating material. In one exemplary embodiment, for example, the passivation layer 520 may include at least one selected from acryl, poly(methyl methacrylate) ("PMMA"), benzocyclobutene ("BCB"), polyimide, acrylate, epoxy, and polyester, etc., but not being limited thereto. The passivation layer 520 may have a height determined not to cover an upper portion of the LED 300, e.g., the second contact electrode 390, such that the second contact electrode 930 is exposed. The second electrode 530 electrically connected to the exposed second contact electrode 390 of the LED 300 and the conductive layer 550 is disposed on the passivation layer 520.

FIG. 2B shows an exemplary embodiment of a vertical-type micro LED. However, exemplary embodiments are not limited thereto, and alternatively, the LED 300 may be a flip-type micro LED in which a first contact electrode and a second contact electrode are arranged in the same direction, or a horizontal-type micro LED, for example. In such an embodiment, locations of the first electrode and the second electrode may correspond to locations of a first contact electrode and a second contact electrode.

Hereinafter, in the drawings for describing a process, components other than the LED 300 in a pixel structure of the display apparatus 100 of FIG. 2B will omitted, for convenience of description. Thus, hereinafter, the process will be described by focusing on operations after the LED 300 is transferred onto the substrate 101, on which the pixel circuit and the first electrode 510 are formed, and the second electrode 530 electrically connected to the LED 300 is formed, as described above with reference to FIG. 2B.

Figure 3:
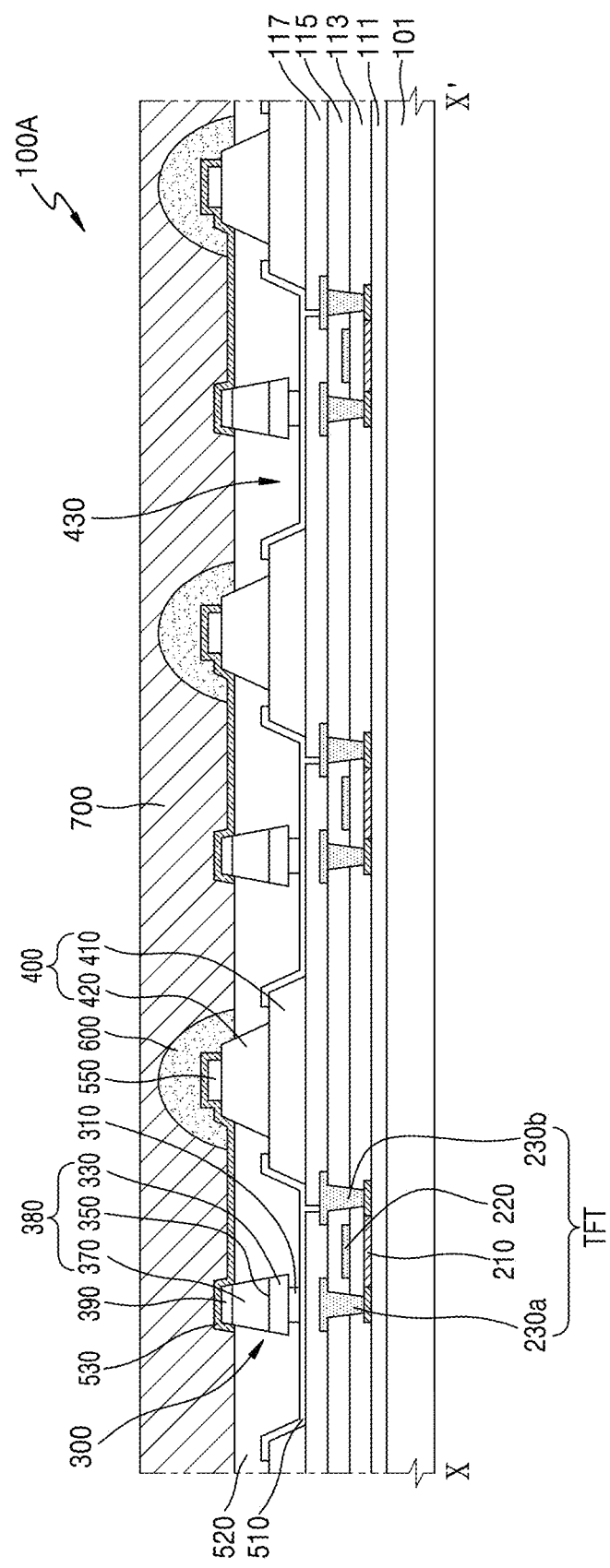
FIG. 3 is a cross-sectional view taken along line X-X' of a display apparatus according to an alternative exemplary embodiment.
Figure 4A:
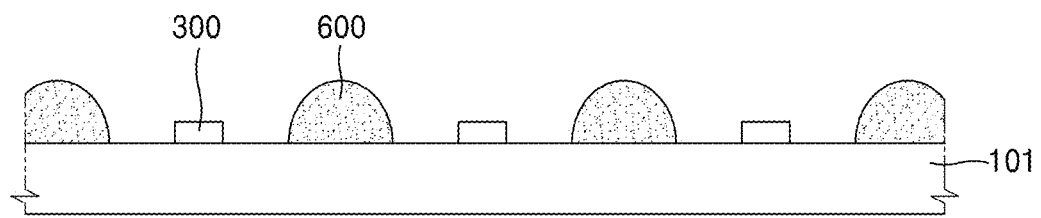
FIGS. 4A and 4B are cross-sectional views showing an exemplary embodiment of a method of manufacturing the display apparatus of FIG. 3.
Figure 4B:
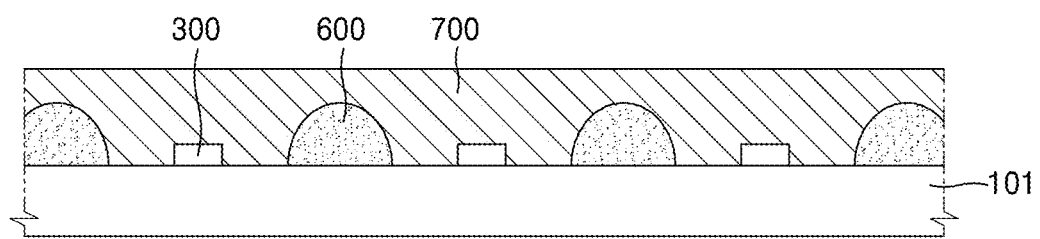

FIG. 3 is a cross-sectional view of a display apparatus 100A according to another exemplary embodiment. FIGS. 4A and 4B are cross-sectional views showing an exemplary embodiment of a method of manufacturing the display apparatus 100A of FIG. 3.

Referring to FIG. 3, according to an exemplary embodiment, the display apparatus 100A may further include a pixel separating layer 600 and a light dispersion layer 700 disposed on the substrate 101 of FIG. 2B.

Referring to FIGS. 3 and 4A, the pixel separating layer 600 may be provided or formed on the bank layer 400 on the substrate 101 of FIG. 2B. The pixel separating layer 600 may be formed by various methods, such as inkjet printing, screen printing, lamination, spin coating, lithography, chemical vapor deposition ("CVD"), etc. In one exemplary embodiment, for example, an ink for forming the pixel separating layer 600 is loaded onto the bank layer 400. In such an embodiment, the loaded ink may be cured by heat curing and/or UV curing to form the pixel separating layer 600. The pixel separating layer 600 may have an approximately hemispherical shape, which is convex, due to a surface tension of the ink.

A sum of a height of the bank layer 400 and a height of the pixel separating layer 600 is greater than a height of the LED 300. Similar to the bank layer 400, the pixel separating layer 600 may define a pixel area, and may function as a light-shielding unit that has low light transmittance by including a material capable of absorbing at least a portion of light, a light reflection material, or a light-scattering material. The pixel separating layer 600 may include a half-transparent or a non-transparent (opaque) insulating material for visible rays. The pixel separating layer 600 may include at least one selected from acryl, photoresist, SiO$_2$, SiNx, PMMA, BCB, polyimide, acrylate, epoxy and polyester, for example, but not being limited thereto. According to an exemplary embodiment, the pixel separating layer 600 may include a non-transparent material, such as a black matrix material. In such an embodiment, the pixel separating layer 600 may include an insulating black matrix material including: a resin or paste which includes an organic resin, a glass paste and a black pigment; or a metal particle, such as nickel, aluminum, molybdenum, an alloy thereof, a metal oxide particle (for example, a chrome oxide), or a metal nitride particle (for example, a chrome nitride). According to another exemplary embodiment, the pixel separating layer 600 may be a DBR having high reflection or a mirror reflector.

In such an embodiment, where the bank layer 400 and the pixel separating layer 600 include a half-transparent or non-transparent insulating material, the bank layer 400 and the pixel separating layer 600 absorb, scatter or reflect light from adjacent pixels, to effectively prevent the light from proceeding to adjacent pixels. Thus, in such an embodiment, a color mix and crosstalk among adjacent pixels are effectively prevented. In an exemplary embodiment, where the bank layer 400 and the pixel separating layer 600 include a material capable of absorbing light, the display apparatus 100A may reduce external light reflection. In an exemplary embodiment, where the bank layer 400 and the pixel separating layer 600 include a material scattering and/or reflecting light, the display apparatus 100A may realize high brightness. The light that is scattered or reflected by controlling a reflection rate of the bank layer 400 and the pixel separating layer 600 may have a white, gray, or black color, or the same color as incident light.

Next, referring to FIG. 4B, the light dispersion layer 700 may be provided or formed throughout the substrate 101 and cover the LED 300 and the pixel separating layer 600. The light dispersion layer 700 may be formed by inkjet printing, screen printing, lamination, spin coating, sputtering, CVD, etc. In one exemplary embodiment, for example, a medium including micro-particles may be provided, e.g., coated, on the substrate 101 as shown in FIG. 4A and the coated medium is cured by heat curing and/or UV curing, to form the light dispersion layer 700.

The light dispersion layer 700 has a planarization function, and also scatters light emitted from the LED 300 to increase light extraction efficiency. The light dispersion layer 700 may include micro-particles for light dispersion, which are distributed in a transparent medium, such as a transparent binder. The size of micro-particles may be tens of nanometers to several micrometers. The binder may include a transparent material, such as an acryl, urethane, or epoxy resin, etc. The micro-particles may be transparent organic particles or inorganic particles. The organic particles may include a multilayered multi-component particle, which is made by forming a particle layer including at least one of homopolymer or copolymer acryl-based particles including methylmethacrylate or 2-ethylhexylacrylate, olefin-based particles, such as polyethylene, and copolymer and homopolymer acryl and olefin-based particles, and covering the particle layer with another type of monomer.

The inorganic particles may include at least one selected from silicon oxide, aluminum oxide, titanium oxide, zirconium oxide, and magnesium fluoride.

Figure 6A:
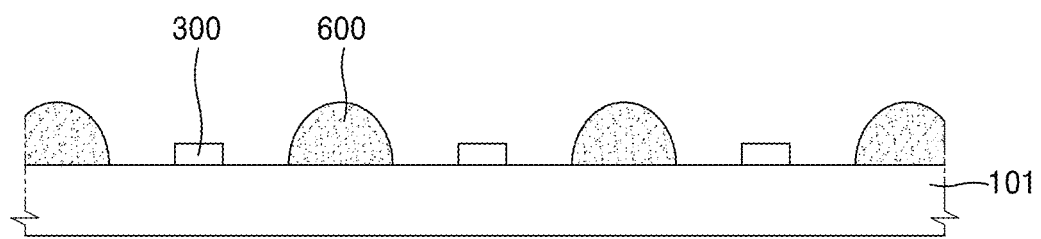
FIGS. 6A through 6C are cross-sectional views showing an exemplary embodiment of a method of manufacturing the display apparatus of FIG. 5.
Figure 6B:
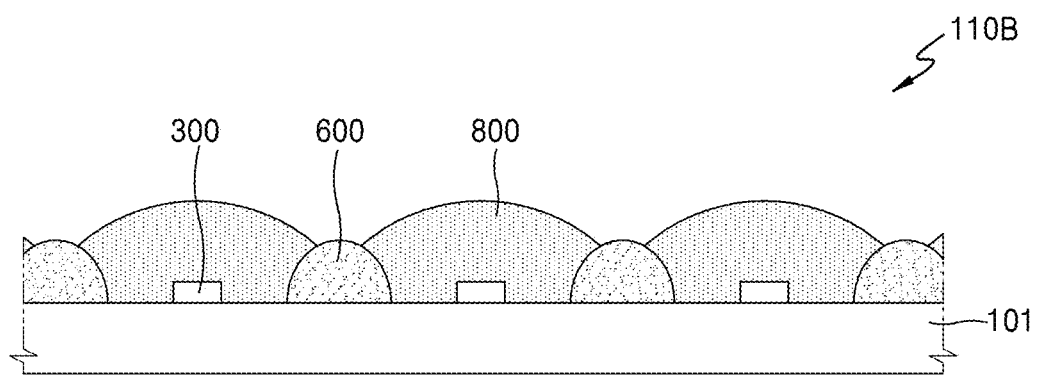
Figure 6C:
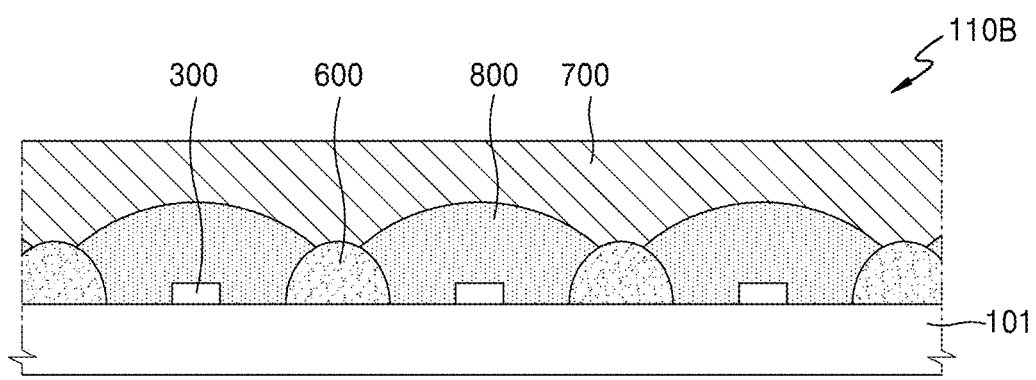

FIG. 5 is a cross-sectional view taken along line X-X' of a display apparatus 100B according to another alternative exemplary embodiment. FIGS. 6A through 6C are cross-sectional views showing an exemplary embodiment of a method of manufacturing the display apparatus 100B of FIG. 5.

Referring to FIG. 5, according to an exemplary embodiment, the display apparatus 100B may further include the pixel separating layer 600, the light dispersion layer 700, and a lens 800 on the substrate 101 of FIG. 2B. The cross-sectional view of the display apparatus in FIG. 5 is substantially the same as the cross-sectional view of the display apparatus in FIG. 3 except for the lens 800. The same or like elements shown in FIG. 5 have been labeled with the same reference characters as used above to describe the exemplary embodiments of the display apparatus shown in FIG. 3, and any repetitive detailed description thereof will hereinafter be omitted or simplified.

Referring to FIG. 6A, the pixel separating layer 600 may be provided or formed on the bank layer 400 on the substrate 101 of FIG. 2B. The pixel separating layer 600 may be formed by various methods, such as inkjet printing, screen printing, lamination, spin coating, lithography, CVD, etc. The pixel separating layer 600 may have an approximately hemispherical shape that is convex. A sum of heights of the bank layer 400 and the pixel separating layer 600 may be greater than a height of the LED 300. Similar to the bank layer 400, the pixel separating layer 600 may function as a light-shielding unit that has low light transmittance by including a material capable of absorbing at least a portion of light, a light reflection material, or a light-scattering material. According to an exemplary embodiment, the pixel separating layer 600 may include a half-transparent insulating material, or a non-transparent insulating material such as a black matrix material, with respect to visible rays. According to another exemplary embodiment, the pixel separating layer 600 may be a DBR having high reflection or a mirror reflector.

Next, referring to FIG. 6B, the lens 800 may be provided or formed on the substrate 101, on which the pixel separating layer 600 is formed, to cover the LED 300. The lens 800 is provided for each pixel P on a side at which light exits, and has a matrix arrangement to correspond to an arrangement of the pixel P. The lens 800 may be formed by inkjet printing, screen printing, lamination, spin coating, sputtering, or CVD. In one exemplary embodiment, for example, an ink for forming the lens 800 is loaded on the LED 300 by a predetermined pitch. The loaded ink has a shape of an approximately hemispherical lens. Next, the loaded ink is cured by heat curing and/or UV curing, to form the lens 800. The lens 800 covers a portion of a side surface of the second pixel separating layer 600, an upper portion of the passivation layer 520, and a portion of the second electrode 530 on the LED 300. Heights of the pixel separating layer 600 and the lens 800 may be adjusted according to an aperture ratio. In an exemplary embodiment, a height of a most convex portion of the lens 800 may be greater than the sum of heights of the bank layer 400 and the pixel separating layer 600 to realize a high aperture ratio.

The lens 800 may include a transparent polymer, such as epoxy, silicone, and urethane. According to an exemplary embodiment, the lens 800 may include a thermoplastic resin, a thermosetting resin or a compound thereof. In one exemplary embodiment, for example, the lens 800 may include at least one selected from: acrylic resin, such as polymethyl methacrylate, poly hydroxy ethyl methacrylate and polycyclohexyl methacrylate; allylic resin, such as polydiethylene glycol-bis-allyl carbonate and polycarbonate; a methacrylic resin; a polyurethane resin; a polyester resin; a polyvinyl chloride resin; a polyvinyl acetate resin; a cellulose resin; a polyamide resin; a fluoride resin; a polypropylene resin; and a polystyrene resin.

The lens 800 may include a material having a refractive index n_lens that is greater than about 1. The material included in the lens 800 may be selected such that the refractive index n_lens of the lens 800, a refractive index n_LED of the LED 300, and a refractive index n_air of air satisfy the following inequation: n_air<n_lens<n_LED. In such an embodiment, where the lens 800 is further included, a refractive index difference on an interface may be reduced, and thus, light loss of the LED 300 to the air may be reduced.

Next, referring to FIG. 6C, the light dispersion layer 700 may be provided or formed throughout the substrate 101 to cover the lens 800 and the pixel separating layer 600. The light dispersion layer 700 may be formed by inkjet printing, screen printing, lamination, spin coating, sputtering, or CVD. The light dispersion layer 700 may include microparticles for light dispersion, which are distributed on a transparent medium, such as a transparent binder.

Light emitted from the LED 300 penetrates the lens 800 and exists to the outside through the light dispersion layer 700.

Figure 7:
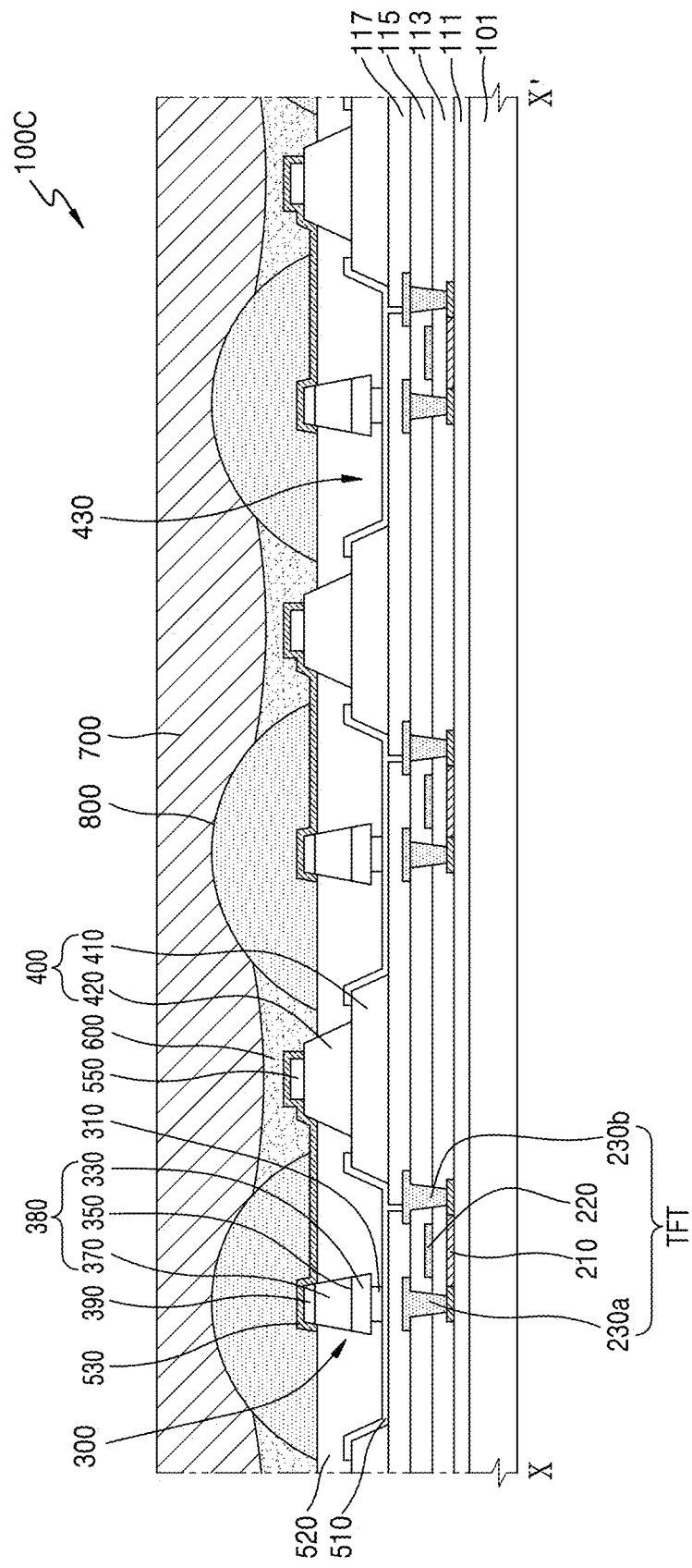
FIG. 7 is a cross-sectional view taken along line X-X' of a display apparatus according to another alternative exemplary embodiment.
Figure 8A:
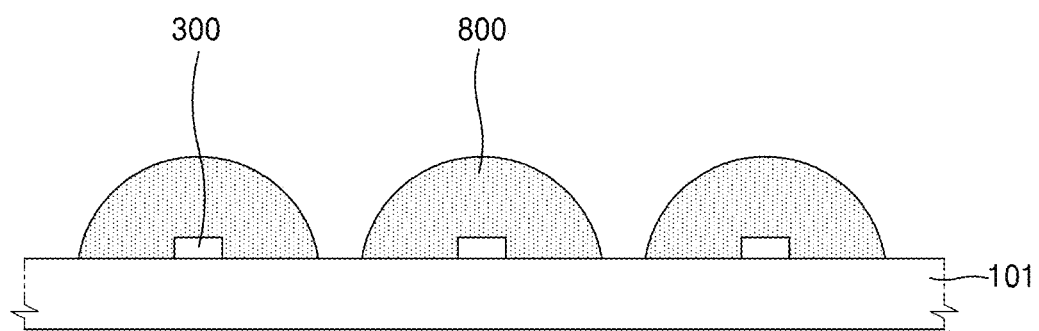
FIGS. 8A through 8C are cross-sectional views showing an exemplary embodiment of a method of manufacturing the display apparatus of FIG. 7.
Figure 8B:
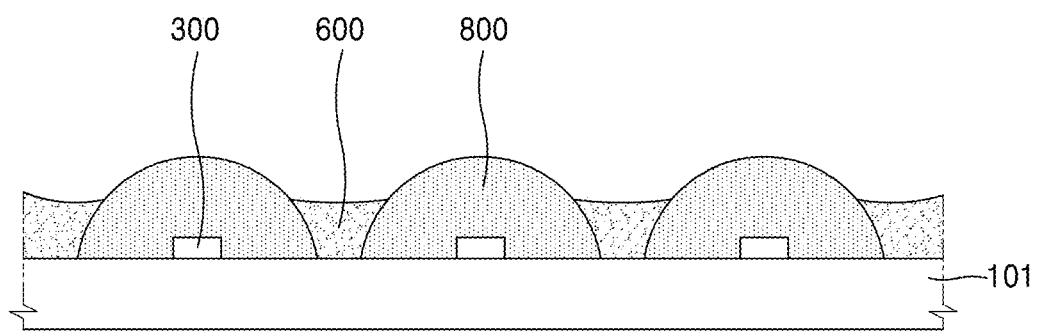
Figure 8C:
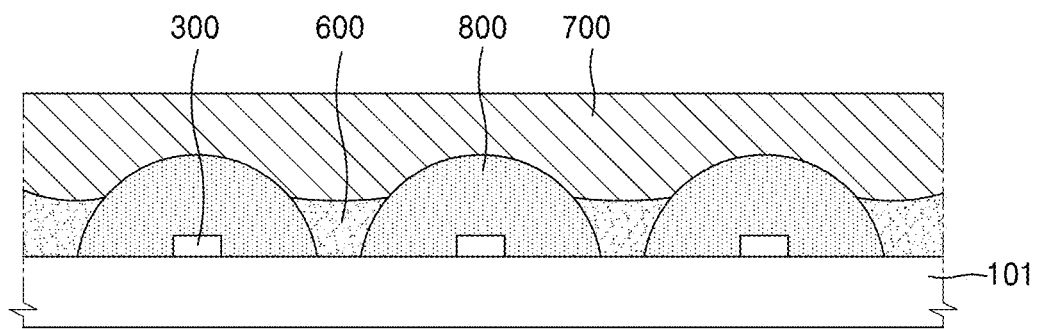

FIG. 7 is a cross-sectional view taken along line X-X' of a display apparatus 100C according to another alternative exemplary embodiment. FIGS. 8A through 8C are cross-sectional views showing an exemplary embodiment of a method of manufacturing the display apparatus 100C of FIG. 7.

Referring to FIG. 7, according to an exemplary embodiment, the display apparatus 100C may further include the pixel separating layer 600, the light dispersion layer 700 and the lens 800 on the substrate 101 of FIG. 2B. The cross-sectional view of the display apparatus in FIG. 7 is substantially the same as the cross-sectional view of the display apparatus in FIG. 5 except that the pixel separating layer 600, the light dispersion layer 700 are disposed on the lens 800. The same or like elements shown in FIG. 7 have been labeled with the same reference characters as used above to describe the exemplary embodiments of the display apparatus shown in FIG. 5, and any repetitive detailed description thereof will hereinafter be omitted or simplified.

Referring to FIG. 8A, in an exemplary embodiment, the lens 800 covering the LED 300 is provided or formed on the substrate 101 of FIG. 2B. The lens 800 may be formed by inkjet printing, screen printing, lamination, spin coating, sputtering, CVD, etc. The lens 800 may include a transparent polymer, such as epoxy, silicon, and urethane. The lens 800 has a shape of an approximately hemispherical lens. In such an embodiment, the lens 800 is provided before providing the pixel separating layer 600, the lens 800 of such an embodiment may be more hemisphere-shaped than the lens 800 of the exemplary embodiment of FIG. 5. The lens 800 covers an upper portion of the passivation layer 520, and a portion of the second electrode 530 on the LED 300.

Next, referring to FIG. 8B, the pixel separating layer 600 is provided or formed between the lens 800, e.g., filled in a space defined between adjacent lens 800. The pixel separating layer 600 may be formed by various methods, such as inkjet printing, screen printing, lamination, spin coating, lithography, CVD, etc. Similar to the bank layer 400, the pixel separating layer 600 may function as a light-shielding layer that has a low transmittance rate by including a material absorbing at least a portion of light, a light reflection material, or a light-scattering material. According to an exemplary embodiment, the pixel separating layer 600 may include a half-transparent insulating material, or a non-transparent insulating material such as a black matrix material, with respect to visible rays. According to an alternative exemplary embodiment, the pixel separating layer 600 may be a DBR having high reflection or a mirror reflector. In such an embodiment, the pixel separating layer 600 is provided after providing the lens 800, the pixel separating layer 600 may contact the outside of the lens 800, e.g., an outer or upper surface of the lens 800. The pixel separating layer 600 has a concave upper portion, and may be disposed lower than the lens 800.

Next, referring to FIG. 8C, the light dispersion layer 700 is provided or formed throughout the substrate 101 to cover the lens 800 and the pixel separating layer 600. The light dispersion layer 700 may be formed by inkjet printing, screen printing, lamination, spin coating, sputtering, or CVD. The light dispersion layer 700 may include microparticles for light dispersion, which are distributed on a transparent medium, such as a transparent binder.

Figure 9:
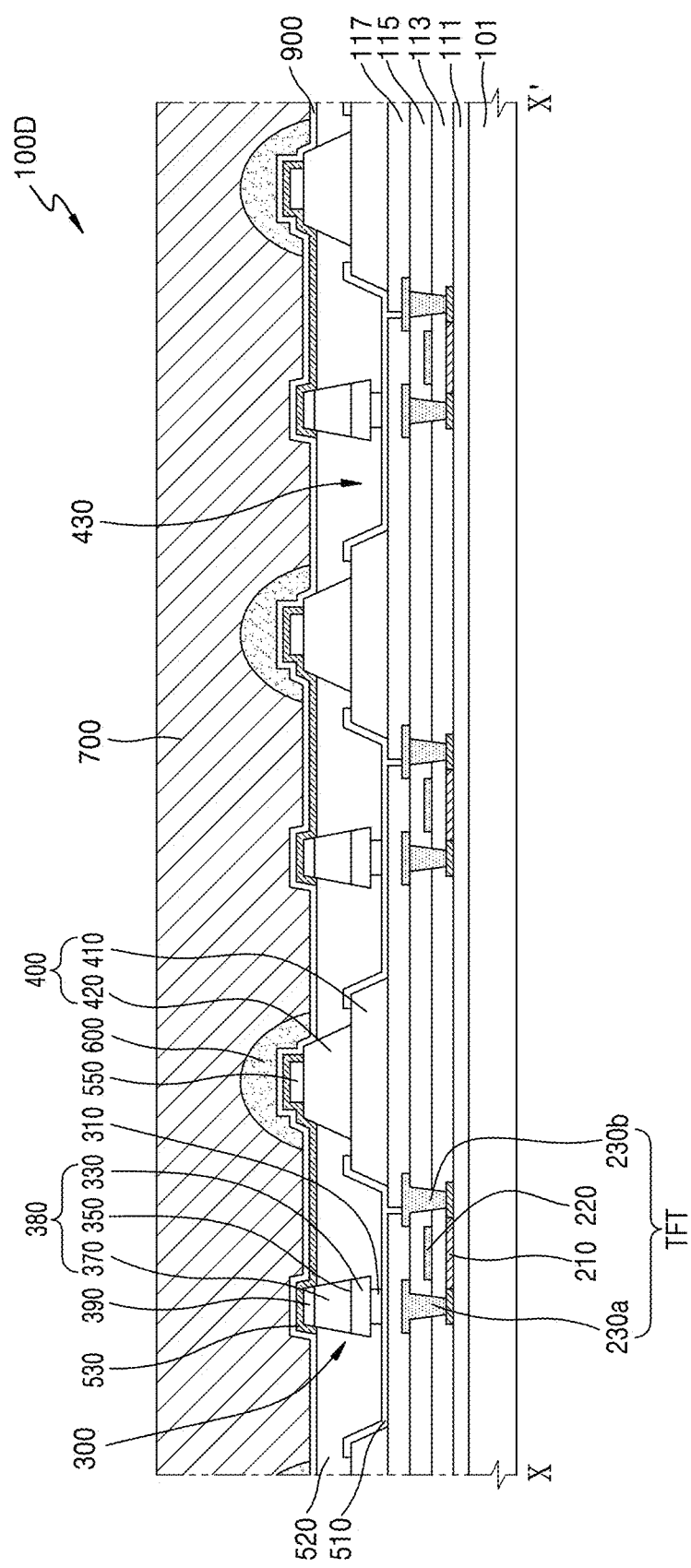
FIG. 9 is a cross-sectional view taken along line X-X' of a display apparatus according to another alternative exemplary embodiment.
Figure 10A:
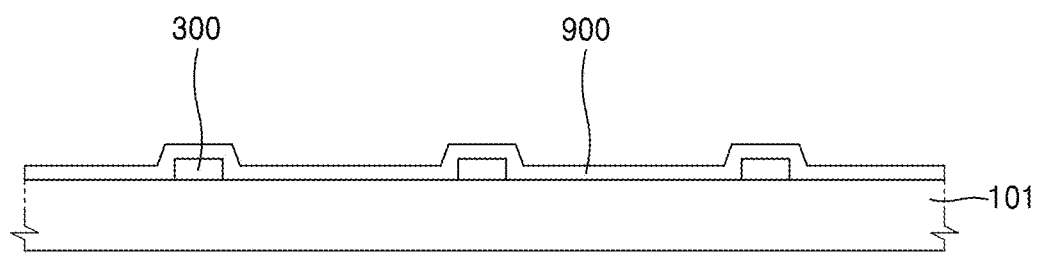
FIGS. 10A through 10C are cross-sectional views showing an exemplary embodiment of a method of manufacturing the display apparatus of FIG. 9.
Figure 10B:
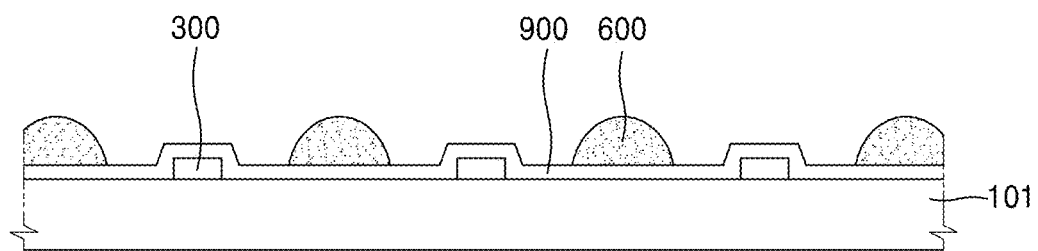
Figure 10C:
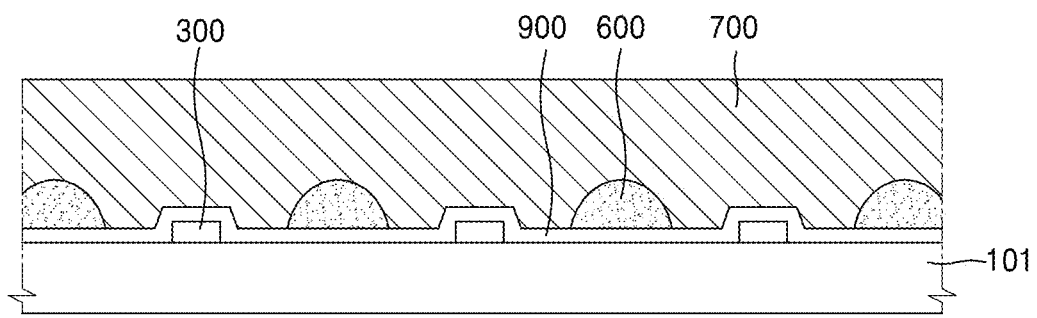

FIG. 9 is a cross-sectional view taken along line X-X' of a display apparatus 100D according to another alternative exemplary embodiment. FIGS. 10A through 10C are cross-sectional views showing an exemplary embodiment of a method of a manufacturing the display apparatus 100D of FIG. 9.

Referring to FIG. 9, according to an exemplary embodiment, the display apparatus 100D may further include the pixel separating layer 600, the light dispersion layer 700 and a protective layer 900 on the substrate 101 of FIG. 2B. The cross-sectional view of the display apparatus in FIG. 7 is substantially the same as the cross-sectional view of the display apparatus in FIG. 5 except for the protective layer 900 that protects the LED 300 and the second electrode 530. The same or like elements shown in FIG. 7 have been labeled with the same reference characters as used above to describe the exemplary embodiments of the display apparatus shown in FIG. 5, and any repetitive detailed description thereof will hereinafter be omitted or simplified.

Referring to FIG. 10A, in an exemplary embodiment, the protective layer 900 is provided or formed on the substrate 101 of FIG. 2 and covers the LED 300 and the second electrode 530. The protective layer 900 may be formed by inkjet printing, screen printing, lamination, spin coating, sputtering, or CVD. The protective layer 900 may be an inorganic insulating layer. The protective layer 900 may have a single-layer structure or a multi-layer structure including an insulating layer including at least one material selected from $SiO_2$, $SiN_x$, $SiON$, $Al_2O_3$, $TiO_2$, $Ta_2O_5$, $HfO_2$, $ZrO_2$, $(Ba, Sr)TiO_3$ ("BST"), and $Pb(Zr, Ti)O_3$ ("PZT"). By the protective layer 900, damage, which may occur to the LED 300 while the pixel separating layer 600 and the light dispersion layer 700 are formed, may be prevented.

Next, referring to FIG. 10B, the pixel separating layer 600 is provided or formed on the bank layer 400. The pixel separating layer 600 may be formed by various methods, such as inkjet printing, screen printing, lamination, spin coating, lithography, CVD, etc. The pixel separating layer 600 may have an approximately hemispherical shape that is convex. A sum of heights of the bank layer 400 and the pixel separating layer 600 is greater than a height of the LED 300. Similar to the bank layer 400, the pixel separating layer 600 may function as a light-shielding layer that has low light transmittance by including a material absorbing at least a portion of light, a light reflection material, or a light scattering material. According to an exemplary embodiment, the pixel separating layer 600 may include a half-transparent insulating material, or a non-transparent insulating material such as a black matrix material, with respect to visible rays. According to another exemplary embodiment, the pixel separating layer 600 may be a DBR having high reflection or a mirror reflector.

Next, referring to FIG. 10C, the light dispersion layer 700 is provided or formed throughout the substrate 101 and covers the protective layer 900 and the pixel separating layer 600. The light dispersion layer 700 may be formed by inkjet printing, screen printing, lamination, spin coating, sputtering, or CVD. The light dispersion layer 700 may include micro-particles for light dispersion, which are distributed in a transparent medium, such as a transparent binder.

Figure 11:
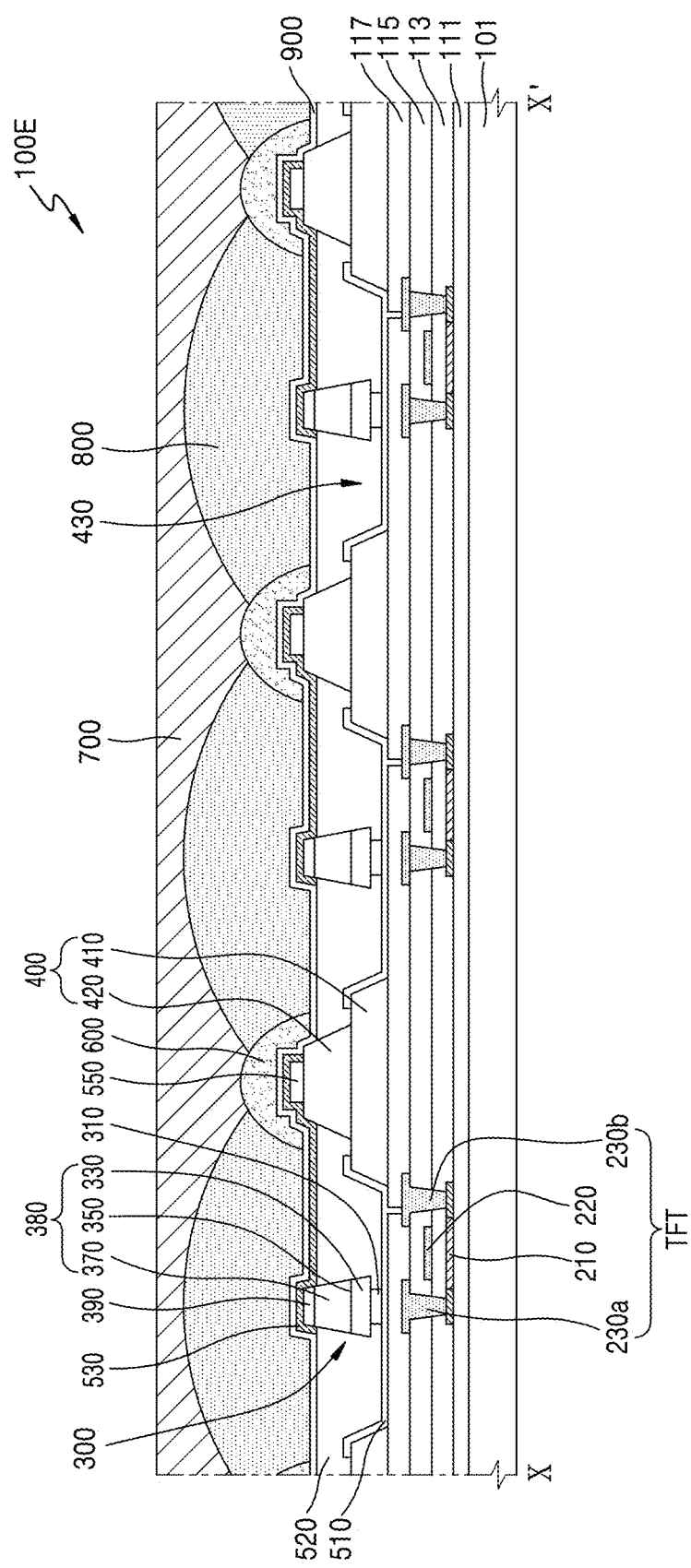
FIG. 11 is a cross-sectional view taken along line X-X' of a display apparatus according to another alternative exemplary embodiment.

FIG. 11 is a cross-sectional view taken along line X-X' of a display apparatus 100E according to another alternative exemplary embodiment. FIGS. 12A through 12D are cross-sectional views showing an exemplary embodiment of a method of manufacturing the display apparatus 100E of FIG. 11.

Referring to FIG. 11, according to an exemplary embodiment, the display apparatus 100E may further include the pixel separating layer 600, the light dispersion layer 700, the lens 800 and the protective layer 900 on the substrate 101 of FIG. 2B. The cross-sectional view of the display apparatus in FIG. 11 is substantially the same as the cross-sectional view of the display apparatus in FIG. 9 except for the lens 800. The same or like elements shown in FIG. 11 have been labeled with the same reference characters as used above to describe the exemplary embodiments of the display apparatus shown in FIG. 9, and any repetitive detailed description thereof will hereinafter be omitted or simplified.

Figure 12A:
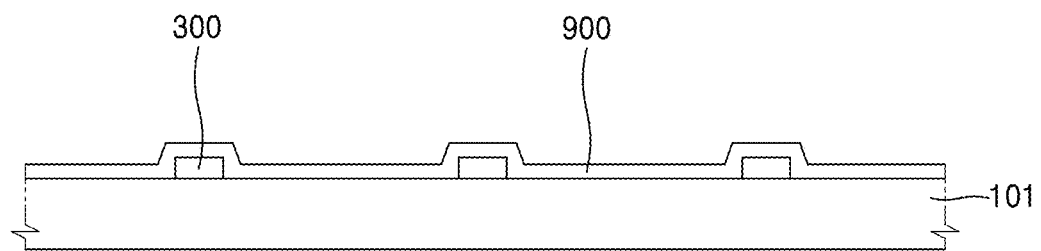
FIGS. 12A through 12D cross-sectional views showing an exemplary embodiment of a method of manufacturing the display apparatus of FIG. 11.

Referring to FIG. 12A, in an exemplary embodiment, the protective layer 900 is provided or formed on the substrate 101 of FIG. 2 and covers the LED 300 and the second electrode 530. The protective layer 900 may be formed by inkjet printing, screen printing, lamination, spin coating, sputtering, or CVD. The protective layer 900 may be an inorganic insulating layer. The protective layer 900 may prevent damage, which may occur to the LED 300 while the pixel separating layer 600, the lens 800, and the light dispersion layer 700 are formed after the protective layer 900.

Figure 12B:
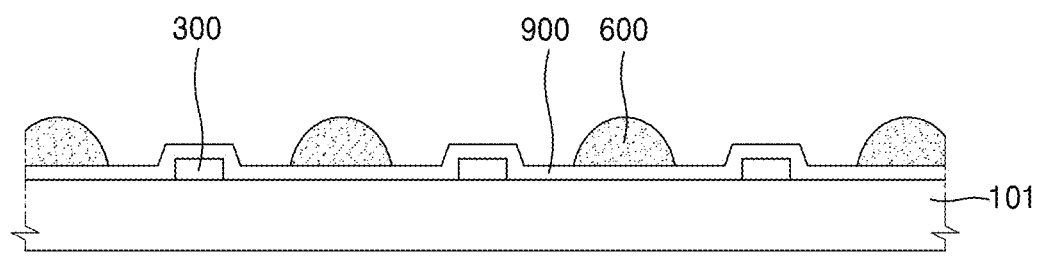

Next, referring to FIG. 12B, the pixel separating layer 600 is provided or formed on the protective layer 900 to correspond to the bank layer 400. The pixel separating layer 600 may be formed by various methods, such as inkjet printing, screen printing, lamination, spin coating, lithography, CVD, etc. The pixel separating layer 600 may have an approximately hemispherical shape that is convex. A sum of heights of the bank layer 400 and the pixel separating layer 600 is greater than a height of the LED 300. Similar to the bank layer 400, the pixel separating layer 600 may function as a light-shielding layer that has low light transmittance by including a material absorbing at least a portion of light, a light reflection material, or a light-scattering material. According to an exemplary embodiment, the pixel separating layer 600 may include a half-transparent insulating material, or a non-transparent insulating material such as a black matrix material, with respect to visible rays. According to another exemplary embodiment, the pixel separating layer 600 may be a DBR having high reflection or a mirror reflector.

Figure 12C:
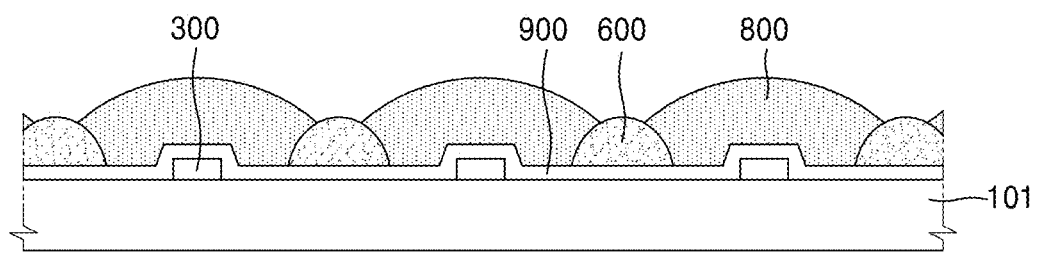

Next, referring to FIG. 12C, the lens 800 is provided or formed on the substrate 101, on which the pixel separating layer 600, is formed to cover the LED 300. The lens 800 may be formed by inkjet printing, screen printing, lamination, spin coating, sputtering, or CVD. The lens 800 may include a transparent polymer, such as epoxy, silicone and urethane. The lens 800 has a shape of an approximately hemispherical lens. The lens 800 covers a portion of a side surface of the pixel separating layer 600, an upper portion of the passivation layer 520, and a portion of the second electrode 530 on the LED 300. A height of the lens 800 is greater than the sum of heights of the bank layer 400 and the pixel separating layer 600.

Figure 12D:
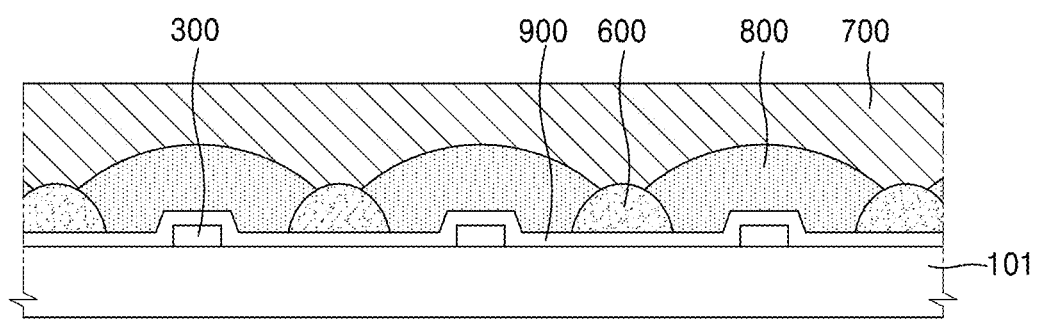

Next, referring to FIG. 12D, the light dispersion layer 700 is provided or formed throughout the substrate 101 and covers the pixel separating layer 600 and the lens 800. The light dispersion layer 700 may be formed by inkjet printing, screen printing, lamination, spin coating, sputtering, or CVD. The light dispersion layer 700 may include micro-particles for light dispersion, which are distributed on a transparent medium, such as a transparent binder.

Figure 13:
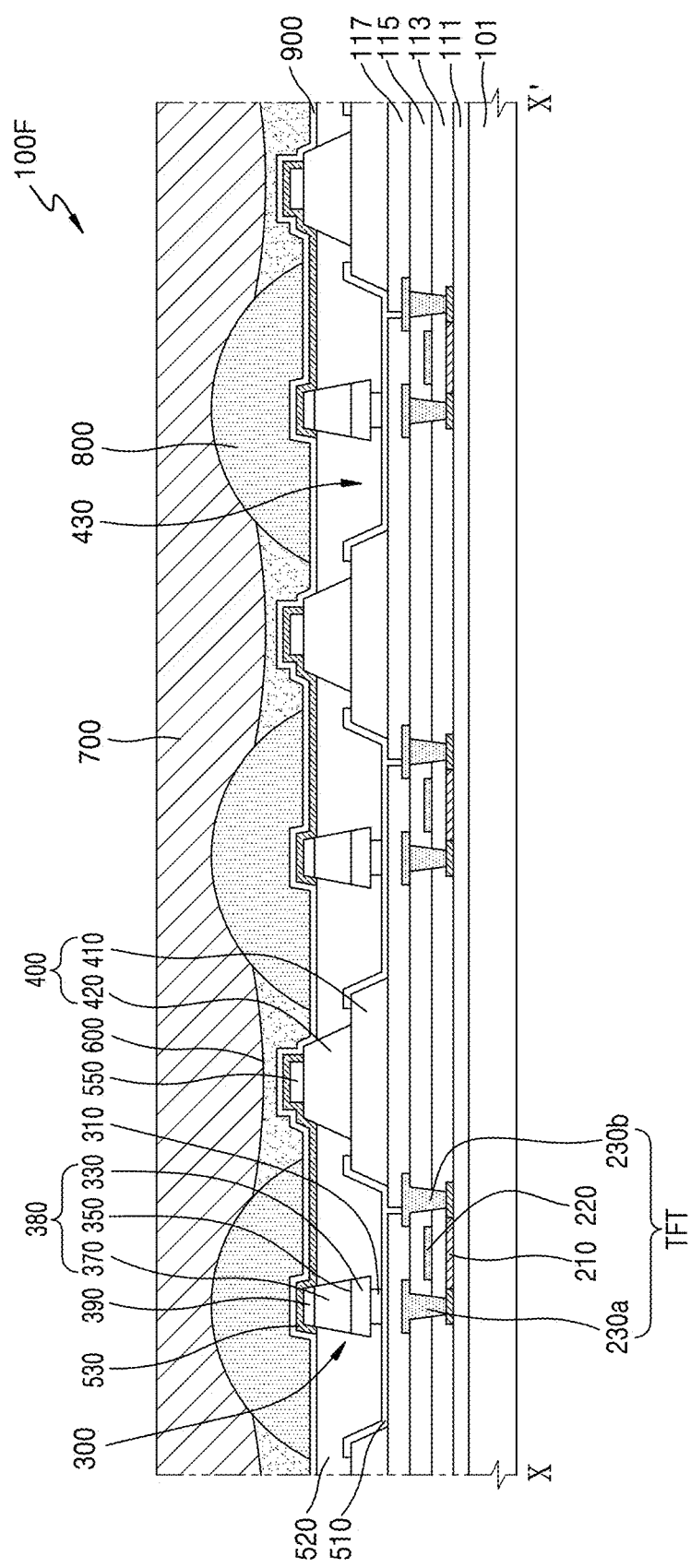
FIG. 13 is a cross-sectional view taken along line X-X' of a display apparatus according to another alternative exemplary embodiment.

FIG. 13 is a cross-sectional view taken along line X-X' of a display apparatus 100F according to another alternative exemplary embodiment. FIGS. 14A through 14D are cross-sectional views showing an exemplary embodiment of a method of manufacturing the display apparatus 100F of FIG. 13.

Referring to FIG. 13, in an exemplary embodiment, the display apparatus 100F may further include the pixel separating layer 600, the light dispersion layer 700, the lens 800, and the protective layer 900 on the substrate 101 of FIG. 2B. The cross-sectional view of the display apparatus in FIG. 13 is substantially the same as the cross-sectional view of the display apparatus in FIG. 11 except that the pixel separating layer 600 and the light dispersion layer 700 are sequentially provided after providing after the lens 800. The same or like elements shown in FIG. 13 have been labeled with the same reference characters as used above to describe the exemplary embodiments of the display apparatus shown in FIG. 11, and any repetitive detailed description thereof will hereinafter be omitted or simplified.

Figure 14A:
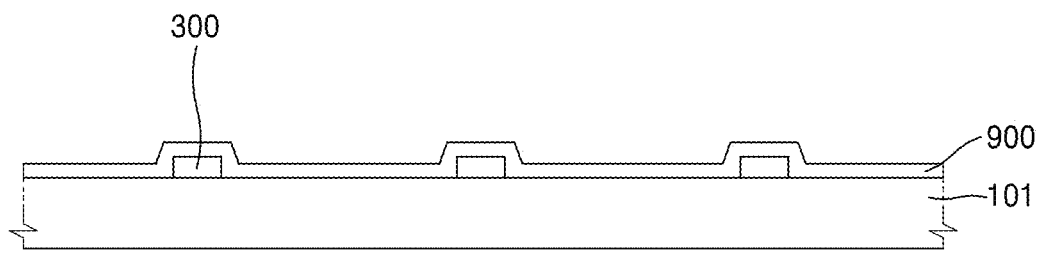
FIGS. 14A through 14D cross-sectional views showing an exemplary embodiment of a method of manufacturing the display apparatus of FIG. 13.

Referring to FIG. 14A, the protective layer 900 is provided or formed on the substrate 101 of FIG. 2B and covers the LED 300 and the second electrode 530. The protective layer 900 may be formed by inkjet printing, screen printing, lamination, spin coating, sputtering, or CVD. The protective layer 900 may be an inorganic insulating layer.

Figure 14B:
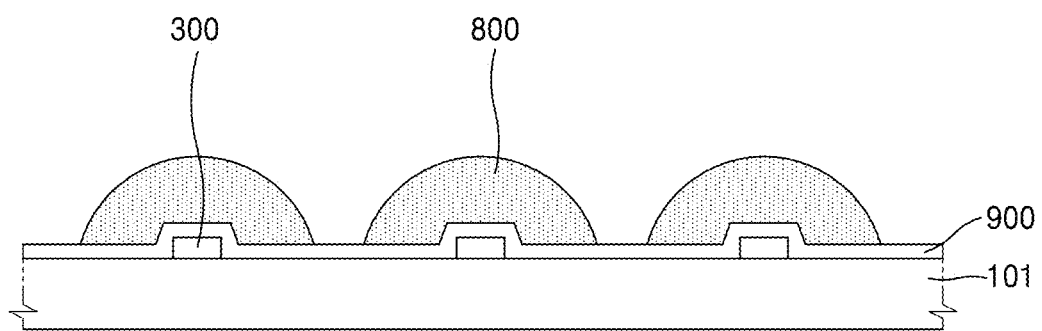

Next, referring to FIG. 14B, the lens 800 is provided or formed on the substrate 101, on which the protective layer 900 is formed, to cover the LED 300. The lens 800 may be formed by inkjet printing, screen printing, lamination, spin coating, sputtering, or CVD. The lens 800 may include a transparent polymer, such as epoxy, silicone, and urethane. The lens 800 has a shape of an approximately hemispherical lens which is convex. In such an embodiment, where the lens 800 is provided before providing the pixel separating layer 600, the lens 800 of the exemplary embodiment of FIG. 13 is more hemisphere-shaped than the lens 800 of the exemplary embodiment of FIG. 11. The lens 800 covers an upper portion of the passivation layer 520, and a portion of the second electrode 530 on the LED 300.

Figure 14C:
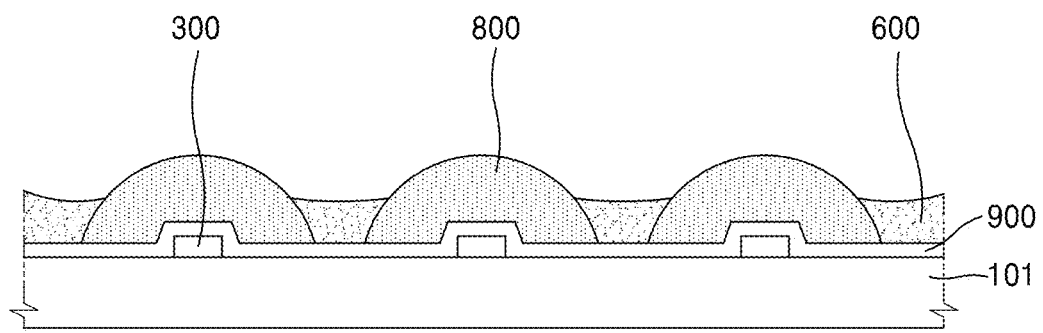

Next, referring to FIG. 14C, the pixel separating layer 600 is formed between the lens 800 to correspond to the bank layer 400 on the protective layer 900. The pixel separating layer 600 may be formed by various methods, such as inkjet printing, screen printing, lamination, spin coating, lithography, CVD, etc. In such an embodiment, where the pixel separating layer 600 is provided after providing the lens 800, the pixel separating layer 600 contacts the outside of the lens 800. The pixel separating layer 600 has a concave upper portion, and is formed lower than the lens 800. Similar to the bank layer 400, the pixel separating layer 600 may function as a light-shielding layer that has low transmittance by including a material absorbing at least a portion of light, a light reflection material, or a light scattering material. According to an exemplary embodiment, the pixel separating layer 600 may include a half-transparent insulating material, or a non-transparent insulating material such as a black matrix material, with respect to visible rays. According to another exemplary embodiment, the pixel separating layer 600 may be a DBR having high reflection or a mirror reflector.

Figure 14D:
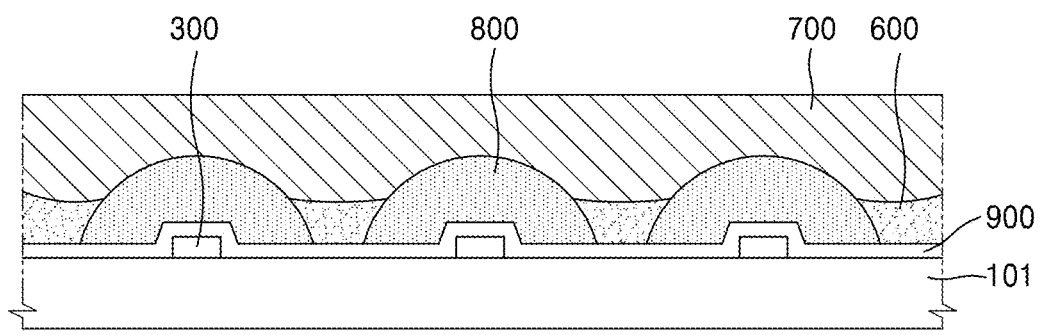

Next, referring to FIG. 14D, the light dispersion layer 700 is provided or formed throughout the substrate 101 to cover the pixel separating layer 600 and the lens 800. The light dispersion layer 700 may be formed by inkjet printing, screen printing, lamination, spin coating, sputtering, or CVD. The light dispersion layer 700 may include micro-particles for light dispersion, which are distributed on a transparent medium, such as a transparent binder.

Figure 15:
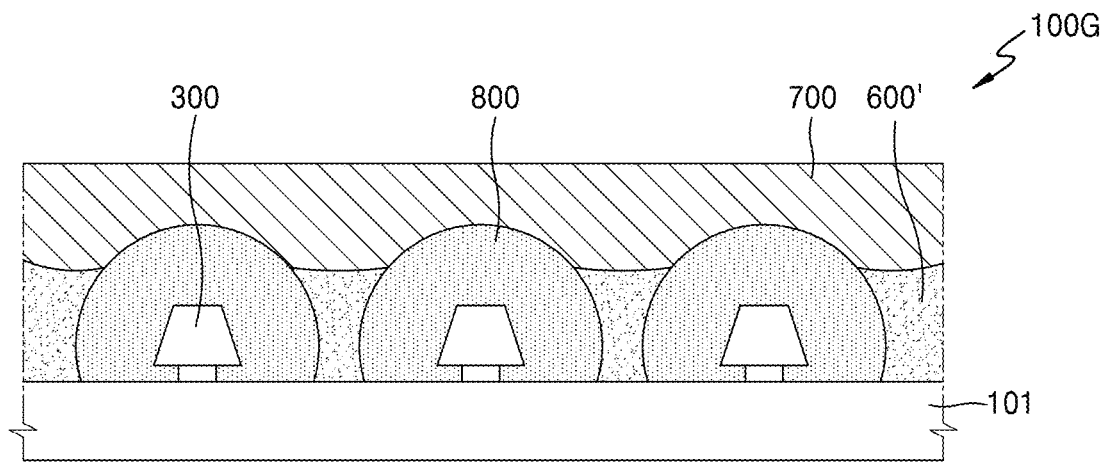
FIG. 15 is a cross-sectional view taken along line X-X' of a display apparatus according to another alternative exemplary embodiment.

FIG. 15 is a cross-sectional view taken along line X-X' of a display apparatus 100G according to another alternative exemplary embodiment.

Referring to FIG. 15, according to an exemplary embodiment, the display apparatus 100G may include the lens 800 that covers the LED 300, a pixel separating layer 600' between the lens 800, and the light dispersion layer 700, on the substrate 101, on which the first bank 410 and the second bank 420 are absent.

According to the exemplary embodiment, as illustrated in FIG. 15, the pixel separating layer 600' and the light dispersion layer 700 are provided after providing the lens 800. Alternatively, the lens 800 and the light dispersion layer 700 may be provided, after providing the pixel separating layer 600'.

According to exemplary embodiments as described herein, an optical system may be disposed on a procedure path of light that is emitted from the LED 300, such that a fill factor of an emission area to an overall area of the display apparatus may be increased. The optical system may include the pixel separating layers 600 and 600' surrounding the LED 300, the light dispersion layer 700 and the lens 800. In such an embodiment, the protective layer 900 may be further included as an inorganic insulating layer to protect the LED 300 while the optical system is formed.

As described above, according to the one or more of the above exemplary embodiments, an emission area of display apparatuses may be increased.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display device comprising:
a substrate;
a bank layer on the substrate, wherein the bank layer defines openings;
a light-emitting diode in each of the openings defined by the bank layer;
a pixel separating layer between the openings, wherein the pixel separating layer on the bank layer does not overlap the openings when viewed from a plan view in a thickness direction of the substrate; and
a light dispersion layer disposed on the light-emitting diode, wherein the light dispersion layer covers an entire portion of the pixel separating layer and an entire portion of the openings when viewed from the plan view in the thickness direction of the substrate,
wherein the light dispersion layer comprises micro-particles such that the light dispersion layer scatters light emitted from the light-emitting diode.

2. The display device of claim 1, wherein the pixel separating layer has a convex upper surface.

3. The display device of claim 1, further comprising:
a lens overlapping the light-emitting diode and having a convex upper surface.

4. The display device of claim 3, wherein the pixel separating layer is between lenses and has a convex upper surface.

5. The display device of claim 3, wherein the pixel separating layer is between lenses and has a concave upper surface.

6. The display device of claim 1, further comprising:
an inorganic insulating layer between the light-emitting diode and the light dispersion layer.

7. The display device of claim 6, further comprising:
a lens between the insulating inorganic layer and the light dispersion layer, wherein the lens overlaps the light-emitting diode.

8. The display device of claim 1, wherein the pixel separating layer comprises a light reflective material.

9. The display device of claim 1, wherein the pixel separating layer comprises a light-scattering material.

10. The display device of claim 1, wherein the pixel separating layer comprises a material capable of absorbing at least a portion of light.

11. The display device of claim 1, further comprising: a first electrode in each of the openings and connected to one electrode of the light-emitting diode; and a second electrode connected to the other electrode of the light-emitting diode.

12. The display device of claim 11, further comprising a conductive layer on the bank layer and connected to the second electrode.

13. The display device of claim 12, wherein the conductive layer is between the bank layer and the pixel separating layer.

* * * * *